United States Patent
Matsuda

(10) Patent No.: US 9,172,385 B2
(45) Date of Patent: Oct. 27, 2015

(54) TIMING ADJUSTMENT CIRCUIT AND SEMICONDUCTOR INTEGRATED CIRCUIT DEVICE

(71) Applicant: SOCIONEXT INC., Yokohama-shi, Kanagawa (JP)

(72) Inventor: Atsushi Matsuda, Akishima (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/508,739

(22) Filed: Oct. 7, 2014

(65) Prior Publication Data

US 2015/0130520 A1      May 14, 2015

(30) Foreign Application Priority Data

Nov. 14, 2013   (JP) ................................. 2013-235911

(51) Int. Cl.
   *H03L 7/06*       (2006.01)
   *H03L 7/085*      (2006.01)
(52) U.S. Cl.
   CPC ...................................... *H03L 7/085* (2013.01)
(58) Field of Classification Search
   USPC .................. 327/147–149, 156–158
   See application file for complete search history.

(56) References Cited

U.S. PATENT DOCUMENTS

| | | | | |
|---|---|---|---|---|
| 6,154,071 | A * | 11/2000 | Nogawa ........................ | 327/156 |
| 8,339,165 | B2 * | 12/2012 | Dunworth et al. ............ | 327/152 |
| 9,008,254 | B2 * | 4/2015 | Lin ................................ | 375/376 |
| 2007/0024335 | A1 * | 2/2007 | Sato ............................... | 327/158 |
| 2008/0069286 | A1 * | 3/2008 | Staszewski et al. ........... | 375/376 |
| 2009/0079719 | A1 * | 3/2009 | Lee ................................ | 345/204 |
| 2010/0117694 | A1 | 5/2010 | Kim | |
| 2010/0141346 | A1 * | 6/2010 | Chen et al. ..................... | 331/15 |
| 2011/0032009 | A1 | 2/2011 | Iwane | |
| 2011/0175866 | A1 * | 7/2011 | Uehara et al. ................. | 345/204 |
| 2011/0221494 | A1 * | 9/2011 | Chen et al. .................... | 327/157 |
| 2011/0298501 | A1 * | 12/2011 | Mosalikanti et al. ......... | 327/143 |
| 2012/0133405 | A1 * | 5/2012 | Jain et al. ...................... | 327/159 |

FOREIGN PATENT DOCUMENTS

| | | |
|---|---|---|
| JP | 2006-025131 A | 1/2006 |
| JP | 2010-114873 A | 5/2010 |
| JP | 2011-055482 A | 3/2011 |

OTHER PUBLICATIONS

Kwon et al., "A 3.0 Gb/s Clock Data Recovery Circuits Based on Digital DLL for Clock-Embedded Display Interface", IEEE, pp. 454-457.

* cited by examiner

*Primary Examiner* — Adam Houston
(74) *Attorney, Agent, or Firm* — Arent Fox LLP

(57) ABSTRACT

A timing adjustment circuit includes a voltage-controlled delay line, a phase detector, a control voltage generation circuit, and a startup circuit. The voltage-controlled delay line receives an input clock signal and generates multi-phase clocks, a delay amount of each of the multi-phase clocks is changed according to a control voltage. The phase detector detects a phase difference between a first clock and a second clock, the first clock is a reference, the second clock is generated from the voltage-controlled delay line. The control voltage generation circuit generates the control voltage on the basis of the detected phase difference. The startup circuit operates for a certain period after activation, and continuously changes the control voltage between a first voltage and a second voltage.

28 Claims, 14 Drawing Sheets

TIMING ADJUSTMENT CIRCUIT AND SEMICONDUCTOR INTEGRATED CIRCUIT DEVICE

CROSS-REFERENCE TO RELATED APPLICATION

This application is based upon and claims the benefit of priority of the prior Japanese Patent Application No. 2013-235911, filed on Nov. 14, 2013, the entire contents of which are incorporated herein by reference.

FIELD

The embodiments discussed herein are related to a timing adjustment circuit and a semiconductor integrated circuit device.

BACKGROUND

Recently, performances of semiconductor memories (for example, DRAM: Dynamic Random Access Memory), processors, and the like used for computers and other information processing devices are significantly improving. Accordingly, it is preferable to correctly and speedily carry out signal transmission among chips mounted on a board and among a plurality of elements and circuit blocks within a chip.

In view of this, for example, there is a known technique in which: a timing adjustment circuit (for example, DLL circuit: Delay Locked Loop Circuit) is provided on the receiving side; a multi-phase clock is generated by delaying the input clock signal through the DLL circuit; and data is read (determined) at appropriate timing.

On the other hand, there is a known SerDes (SERializer/DESerializer) that interconverts serial data and parallel data at a high-speed interface such as a computer bus, and a DLL circuit is adopted in the SerDes as well.

The DLL circuit has a plurality of cascade-connected delay units so as to control, for example, a phase difference between a signal from a first delay unit (0 degree) and a signal from a second delay unit (360 degree) on latter stage of the first delay unit to become 0.

Then, the DLL circuit generates a plurality of signals with different phases (a multi-phase clock) using signals from the delay units between the first delay unit and the second delay unit. Note that a DLL circuit (a timing adjustment circuit) is not only adopted in SerDes but also widely adopted in a variety of electronic circuits (semiconductor integrated circuit devices).

As described above, the DLL circuit that has a plurality of cascade-connected delay units is adopted, for example, in a variety of electronic circuits such as SerDes. With such electronic circuits that adopt the DLL circuit, there is a possibility that the Phase Frequency Detector (PFD: phase detector) in the DLL circuit malfunctions, for example, upon startup by power application.

In other words, when the frequency of the input signal (an input clock signal) of the DLL circuit becomes higher, the operable range of the PFD is narrowed, thus, for example, the PFD malfunctions upon startup, which possibly makes generation of timing-adjusted output signals difficult.

In this regard, various timing adjustment circuits have been proposed.

Patent Document 1: Japanese Laid-open Patent Publication No. 2010-114873

Patent Document 2: Japanese Laid-open Patent Publication No. 2006-025131

Patent Document 3: Japanese Laid-open Patent Publication No. 2011-055482

Non-Patent Document 1: Kwon, Jae-Wook, et al., "A 3.0 Gb/s clock data recovery circuits based on digital DLL for clock-embedded display interface," ESSCIRC (ESSCIRC), 2012 Proceedings of the, IEEE, September 2012

SUMMARY

According to an aspect of the embodiments, there is provided a timing adjustment circuit including a voltage-controlled delay line, a phase detector, a control voltage generation circuit, and a startup circuit.

The voltage-controlled delay line receives an input clock signal and generates multi-phase clocks, a delay amount of each of the multi-phase clocks is changed according to a control voltage. The phase detector detects a phase difference between a first clock and a second clock, the first clock is a reference, the second clock is generated from the voltage-controlled delay line.

The control voltage generation circuit generates the control voltage on the basis of the detected phase difference. The startup circuit operates for a certain period after activation, and continuously changes the control voltage between a first voltage and a second voltage.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First, before describing embodiments of a timing adjustment circuit and a semiconductor integrated circuit device, an example of a timing adjustment circuit and the problematic points thereof are described with reference to FIGS. 1 to 6C.

Figure 1:
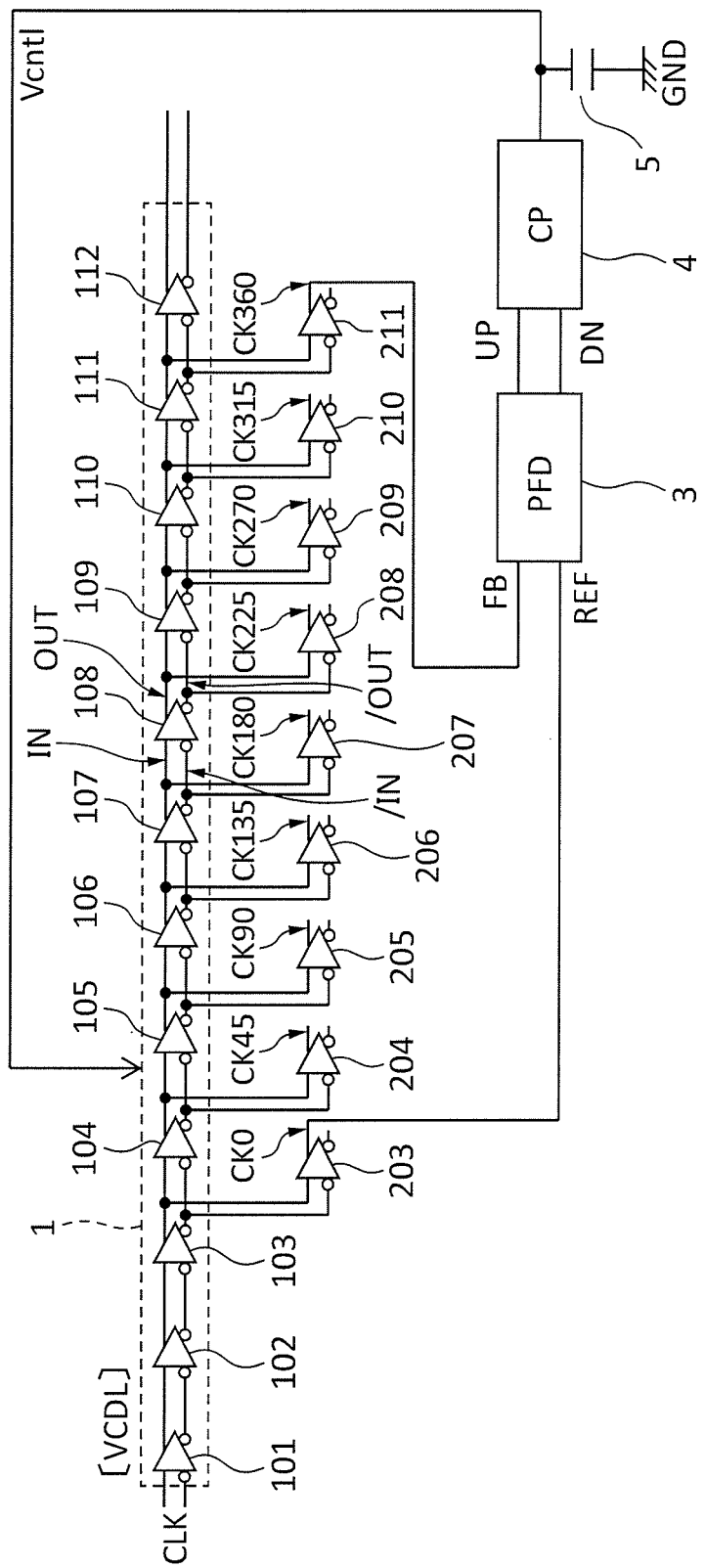
FIG. 1 is a block diagram depicting an example of a timing adjustment circuit.

FIG. 1 is a block diagram depicting an example of the timing adjustment circuit (a DLL circuit). In FIG. 1, the reference sign 1 indicates a Voltage-Controlled Delay Line (VCDL), 101 to 112 indicate delay units, and 203 to 211 indicate waveform-shaping units. Further, the reference sign 3 indicates a phase frequency detector (PFD: a phase detector), 4 indicates a Charge Pump (CP), and 5 indicates a capacitor.

As depicted in FIG. 1, the VCDL 1 has a plurality of cascade-connected delay units 101 to 112, and the output signals of the delay units 103 to 111 are respectively output via the corresponding waveform-shaping units 203 to 211.

The waveform-shaping units 203 to 211 are, for example, buffer circuits that output the output signals of the delay units 103 to 111 by amplifying the amplitude level of the output signals to a typical logic level. The buffer circuits are, for example, Complementary Metal-Oxide Semiconductor (CMOS) buffer circuits.

The output signal of the waveform-shaping unit 203, i.e., a signal (CK0: reference clock signal) REF obtained by shaping the waveform of the output signal (a signal with 0-degree phase) of the delay unit 103 is given to one input of the PFD 3.

Further, the output signal of the waveform-shaping unit 211, i.e., a signal (CK360: feedback clock signal) FB obtained by shaping the waveform of the output signal (a signal with 360-degree phase) of the delay unit 111 is given to the other input of the PFD 3.

The phase frequency detector (PFD) 3 detects a phase difference between the output signal (reference clock signal) REF of the waveform-shaping unit 203 and the output signal (feedback clock signal) FB of the waveform-shaping unit 211 that have been input to the PFD 3, and outputs an UP signal UP or a DOWN signal DN to the CP 4.

The charge pump (CP) 4 controls an electric charge that the capacitor 5 stores according to the signal UP, DN from the PFD 3. As such, the control voltage Vcntl is controlled so that the phases of the reference clock signal REF and the feedback clock signal FB synchronize to each other (360 degrees (=0 degree)).

In FIG. 1, seven delay units 104 to 110 are provided between the delay unit (first delay unit) 103 and the delay unit (second delay unit) 111. Then, by controlling to synchronize the phases of the signal REF corresponding to the output signal CK0 of the first delay unit 103 and the signal FB corresponding to the output signal CK360 of the second delay unit 111, eight-phase clocks CK0, CK45, CK90, . . . , CK360 may be obtained.

When n and m are positive integers and n is smaller than m, for example, the reference clock signal REF is output from the n-th stage delay unit, and the feedback clock signal FB is output from the m-th stage delay unit.

Figure 2:
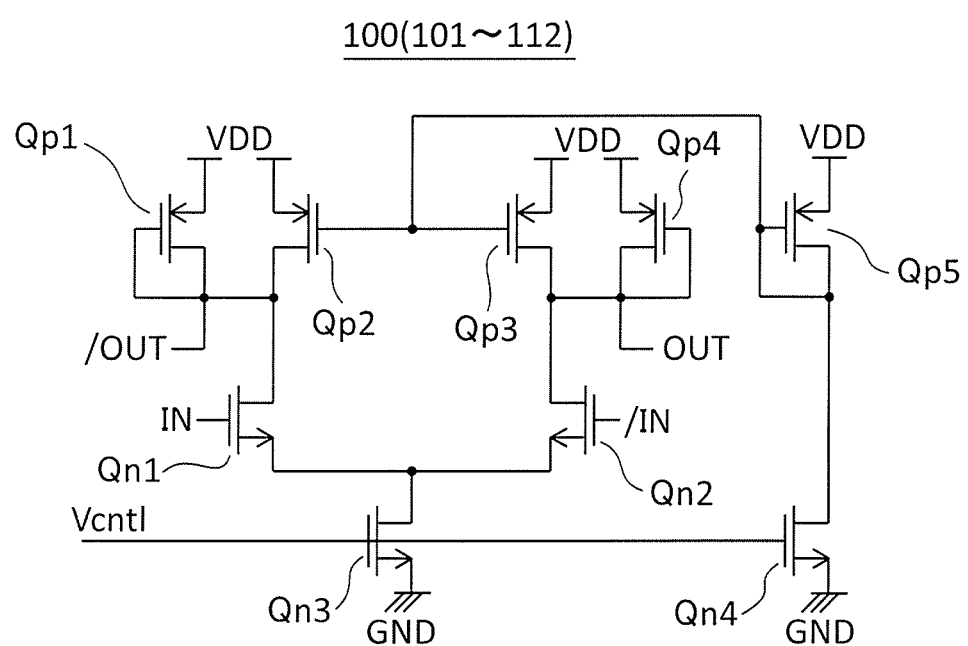
FIG. 2 is a circuit diagram depicting an example of a delay unit in the timing adjustment circuit depicted in FIG. 1.
Figure 3A:
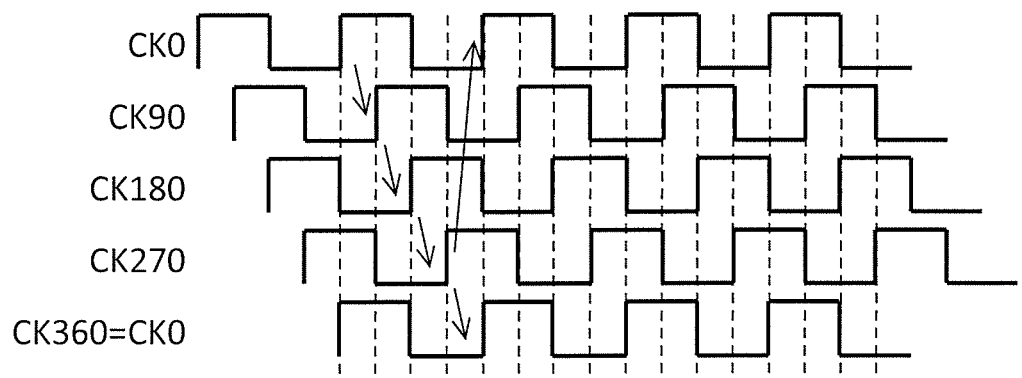
FIGS. 3A and 3B are diagrams illustrating the operation of the timing adjustment circuit depicted in FIG. 1.
Figure 3B:
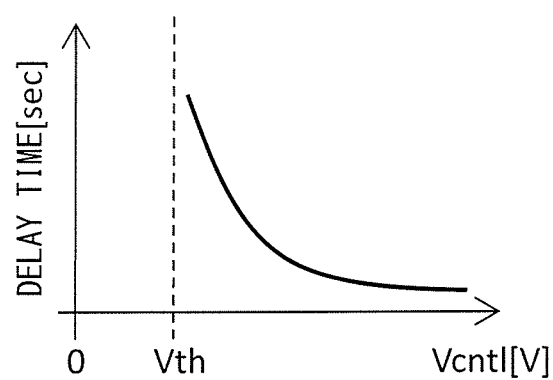

FIG. 2 is a circuit diagram depicting an example of a delay unit in the timing adjustment circuit depicted in FIG. 1. FIGS. 3A and 3B are diagrams illustrating the operation of the timing adjustment circuit depicted in FIG. 1. FIG. 3A depicts a relationship among the signals CK0, CK90, CK180, CK270, and CK360; FIG. 3B depicts a relationship between the control voltage Vcntl and delay time.

As depicted in FIG. 2, the delay units 100 (101 to 112) all have the same circuit configurations, and each has p-channel MOS (pMOS) transistors Qp1 to Qp5 and n-channel MOS (nMOS) transistors Qn1 to Qn4.

Now, take a delay unit 108 of FIG. 1 as an example depicting the correspondence relationship. The gates of differential pair transistors Qn1 and Qn2 at the input in the delay unit 100 (108) depicted in FIG. 2 respectively correspond to the differential inputs IN and /IN. The input IN indicates a positive logic (non-inverted logic) input and /IN indicates a negative logic (inverted logic) input.

Further, the connection node of the drain of the transistor Qp2 (the gate and drain of the transistor Qp1) and the drain of the transistor Qn1 corresponds to the negative logic (inverted logic) output /OUT. Moreover, a connection node of the drain of the transistor Qp3 (the gate and drain of the transistor Qp4) and the drain of the transistor Qn2 corresponds to the positive logic (non-inverted logic) output OUT.

As depicted in FIG. 2, the control voltage Vcntl is applied to the gates of the nMOS transistors Qn3 and Qn4, and the drive capability (flowing current) of the transistors Q3 and Q4 are controlled by the voltage level of the control voltage Vcntl.

When the voltage level of the control voltage Vcntl is high, the transistor Qn3 turns sufficiently ON and the transistor Qn4 also turns sufficiently ON, whereby the gate voltages of the transistors Qp2 and Qp3 are low. In this way, the drive capability of the delay unit 100 becomes large, shortening the delay time. On the other hand, when the level of the control voltage Vcntl is low, the delay time caused by the delay unit 100 becomes longer.

In other words, as depicted in FIG. 3B, the control voltage Vcntl is 0 (Vcntl=0) in the initial state, where the VCDL 1 (delay units 101 to 112) does not propagate a signal. Further, the reference clock signal REF and the feedback clock signal FB that have been input to the PFD 3 do not transit from 0 (REF=0, FB=0). Thus, the control voltage Vcntl maintains the initial state (Vcntl=0).

Each of the delay units 100 (101 to 112) starts operation, for example, when the level (voltage) of the control voltage Vcntl exceeds the threshold voltage Vth of the transistors Qn3 and Qn4. As the level (voltage) of the control voltage Vcntl becomes higher, the drive capability of each delay unit becomes higher, thus shortening the delay time.

Note that the waveform-shaping units 203 to 211 have all the same circuit configurations, and the delay time of each waveform-shaping unit is fixed. Therefore, for example, when the DLL circuit (timing adjustment circuit) is locked, the eight-phase clock output from the waveform-shaping units 203 to 211 corresponds to eight-phase clocks CK0, CK45, CK90, . . . , CK360 with phase difference of 45 degrees each, which are output from the delay units 103 to 111.

Next, the output signal from the delay units 103 to 111 will be described by eliminating the fixed delay time caused by the waveform-shaping units 203 to 211 and considering the output signal as multi-phase clocks CK0 to CK360 to simplify the description.

Referring to FIG. 3A, the output signal of the delay units 103, 105, 107, 109, and 111 of FIG. 1 will be described as the output signal of the waveform-shaping units 203, 205, 207, 209, and 211 (clock signals CK0, CK90, CK180, CK270, CK360).

The signal CK0 is a signal that is obtained by delaying the input clock signal CLK by three stages of the delay units 101 to 103. The input clock signal CLK represents, for example, a differential (complementary) input clock signal of positive and negative logic.

The signal CK90 is a signal obtained by delaying the input clock signal CLK by five stages of the delay units 101 to 105, i.e., a signal obtained by delaying the output signal CK0 of the delay unit 103 further by two stages of the delay units 104 and 105.

Further, the signal CK180 is a signal obtained by delaying the input clock signal CLK by seven stages of the delay units 101 to 107, i.e., a signal obtained by delaying the output signal CK90 of the delay unit 105 further by two stages of the delay units 106 and 107. Then, other signals CK270, CK360 (=CK0) are similarly generated by sequentially delaying by the delay units.

While four-phase clocks CK0 (CK360), CK90, CK180, CK270 are depicted in FIG. 3A, eight-phase clocks CK0, CK45, CK90, . . . , CK360 or other multi-phase clocks may similarly be generated by changing the number of stages of the delay units.

The DLL circuit (timing adjustment circuit) described with reference to FIGS. 1 and 2 generates a multi-phase (eight-phase) clock signal by sequentially delaying the input clock signal CLK. The control voltage Vcntl is applied to the gates of the transistors Qn3 and Qn4 of all the delay units 101 to 112 (100) and the level of the control voltage Vcntl is feedback-controlled so as to synchronize the signals REF and FB.

As such, by synchronizing (adjusting to 0 degree) the phases of the reference clock signal REF and the feedback clock signal FB, eight signals (eight-phase clocks: multi-phase clocks) with phase difference of 45 degrees each are obtained from the delay units 103 to 111.

Note that, while the delay units 101 to 112 and the waveform-shaping units 203 to 211 are of differential configurations, the delay units 101 to 112 and the waveform-shaping units 203 to 211 may be of single-ended configurations. It is to be appreciated that the configuration of the VCDL 1, the number of stages of delay units provided between the first delay unit 103 and the second delay unit 111, the circuit configuration of the delay units and the waveform-shaping units and the like may be modified in a variety of ways.

Meanwhile, in the above-described FIG. 2, when the control voltage is defined as Vcntl=0V upon startup, the DLL circuit (timing adjustment circuit) as depicted in FIG. 1 is not activated as the delay units 101 to 112 (100) that configure the VCDL 1 do not operate. Thus, a case in which a power supply voltage (high potential power supply voltage) VDD is given as a control voltage Vcntl upon startup will be described with reference to FIGS. 4A and 4B.

Figure 4A:
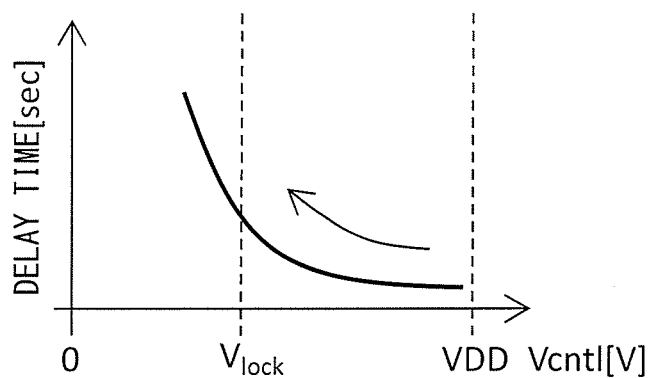
FIGS. 4A and 4B are diagrams illustrating a delay upon startup in the timing adjustment circuit depicted in FIG. 1.
Figure 4B:
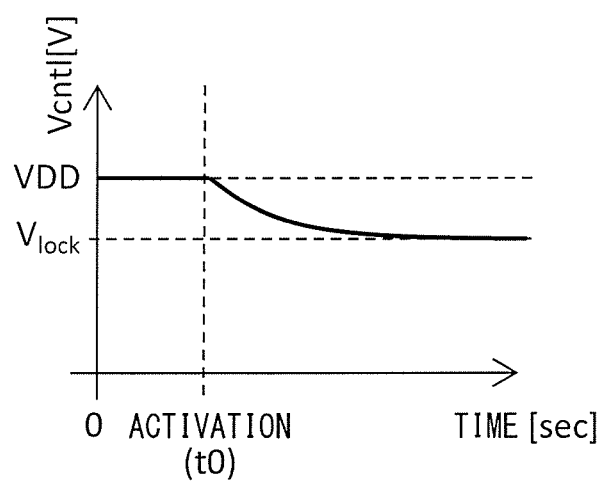

FIGS. 4A and 4B are diagrams illustrating a delay of the timing adjustment circuit depicted in FIG. 1 upon startup. FIG. 4A depicts a relationship between the control voltage Vcntl and delay time; FIG. 4B depicts a time transition of the control voltage Vcntl upon activation (t0).

First, by giving a power supply voltage (high potential power supply voltage) VDD as the control voltage Vcntl and, then, decreasing the level of the control voltage Vcntl therefrom, the delay time of one delay unit 100 (101 to 112) changes as depicted in FIG. 4A.

Further, by giving a power supply voltage VDD as the control voltage Vcntl upon activation and, then, performing feedback control by the above-described timing adjustment circuit (DLL circuit), the control voltage Vcntl changes toward the lock voltage Vlock where stable multi-phase clocks are generated, as depicted in FIG. 4B.

FIGS. 5A, 5B, 5C and 5D are diagrams illustrating the operation of the phase frequency detector in the timing adjustment circuit depicted in FIG. 1 for different input clock signals.

Figure 5C:
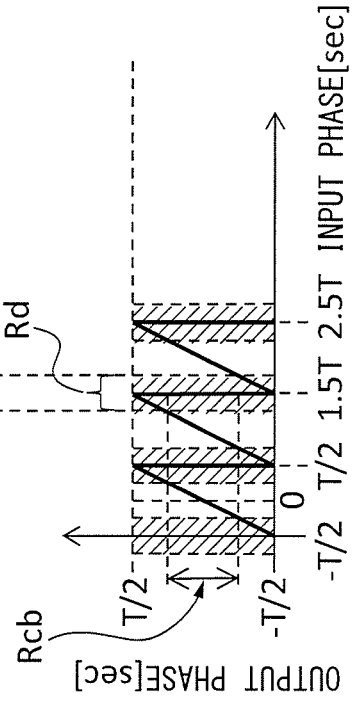
FIGS. 5A, 5B, 5C and 5D are diagrams illustrating the operation of the phase frequency detector in the timing adjustment circuit depicted in FIG. 1 for different input clock signals.
Figure 5D:
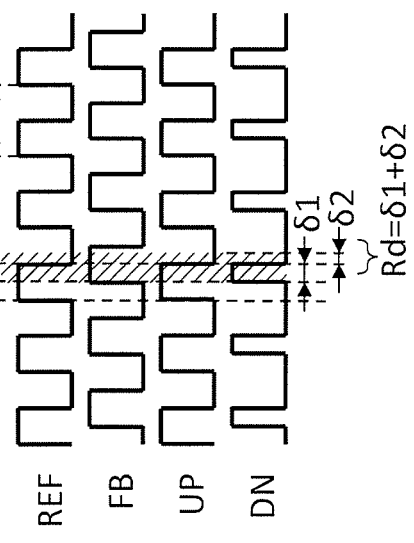
Figure 5A:
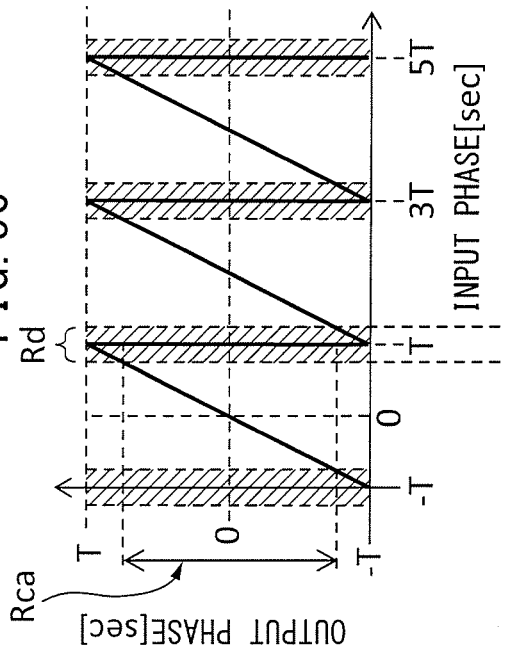
Figure 5B:
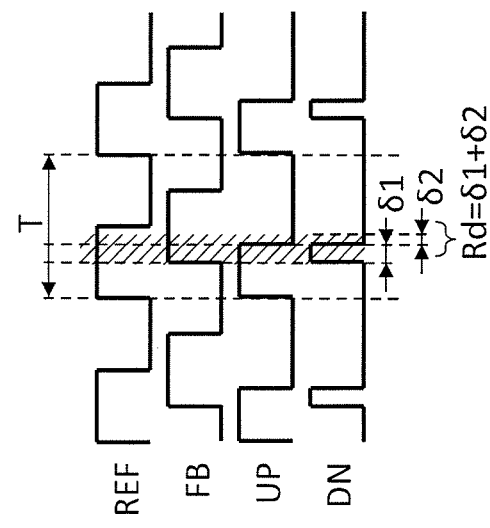

FIGS. 5A and 5C depict when the input clock signal CLK is a first frequency; FIGS. 5B and 5D depict when the input clock signal CLK is a second frequency that is twice as much the first frequency. As the frequency of the input clock signal CLK, for example, approximately several GHz to tens of GHz are assumed.

Further, FIGS. 5A and 5B depict the input signals REF, FB and the output signals UP, DN of the PFD 3; FIGS. 5C and 5D depict a relationship between the input phase and output phase of the PFD 3. Note that FIGS. 5A and 5B depict when the reference clock signal REF rises before the rising timing of the feedback clock signal FB (the phase of REF is advanced than the one of FB).

As a control upon activation, for example, the control voltage Vcntl when starting the delay control of the VCDL 1 is set a voltage higher than the lock voltage Vlock. As such, the reference clock signal REF is masked for a predetermined period, and the reference clock signal REF is output after outputting (rising of) the feedback clock signal FB.

Figure 7:
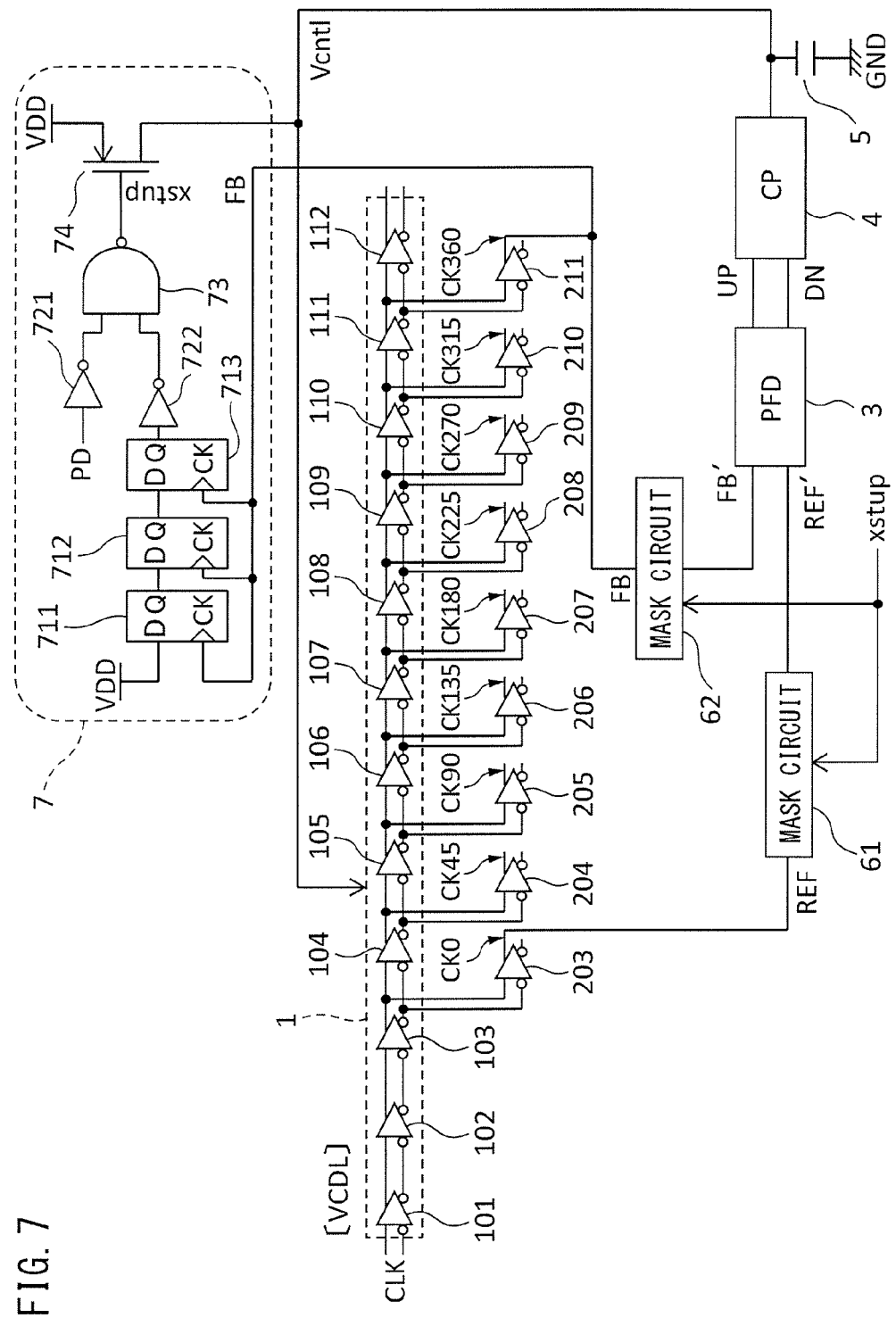
FIG. 7 is a block diagram depicting a first embodiment of the timing adjustment circuit.

Thus, while not depicted in FIG. 1, for example, a circuit equivalent to mask circuits 61, 62 as will be described in FIG. 7 is provided in order to output the reference clock signal REF after the feedback clock signal FB upon activation. Note that, when the REF is output after the FB, a DOWN signal DN is output first from the PFD 3.

Further, to avoid the situation in which neither an UP signal UP nor a DOWN signal DN is output, a simultaneous ON period δ1 where both signals UP and DN are output as depicted in FIGS. 5A and 5B is normally provided. Note that the reference sign δ2 indicates a setup period, during which the PFD 3 detects a phase difference from the transition (rising timing) of the signals REF and FB and controls the signals (pulses) UP, DN.

As depicted from the comparison of FIGS. 5A and 5B, even when the frequency of the input clock signal CLK becomes twice as much (a cycle T becomes half: T/2), the simultaneous ON period δ1, during which the signals UP, DN are simultaneously output, and the setup period δ2 of the PFD 3 do not change.

In other words, as depicted from the comparison of FIGS. 5C and 5D, even when the frequency of the input clock signal CLK becomes twice as much, the non-operation range Rd (=δ1+δ2) where the PFD 3 does not properly operate does not change. Then, when the frequency of the input clock signal CLK becomes twice as much in the output phase of the PFD 3, the normal operation range (operable phase range) decreases dramatically from Rca to Rcb.

Figure 6A:
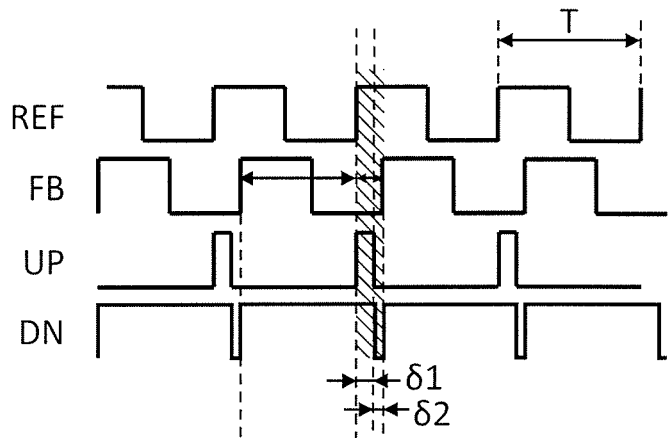
FIGS. 6A, 6B and 6C are diagrams illustrating a normal operation state and malfunction state of the phase frequency detector in the timing adjustment circuit depicted in FIG. 1.
Figure 6B:
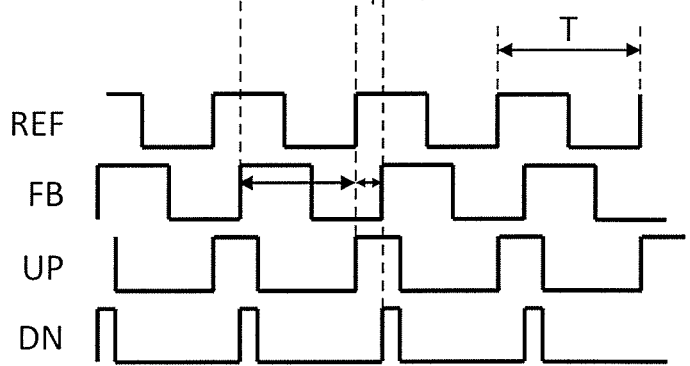
Figure 6C:
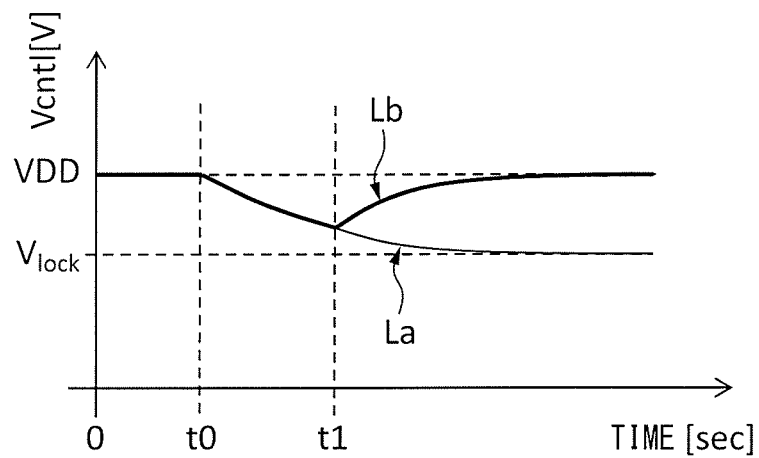

FIGS. 6A, 6B and 6C are diagrams illustrating a normal operation state and malfunction state of the phase frequency detector in the timing adjustment circuit depicted in FIG. 1. FIGS. 6A and 6B depict input and output signals REF, FB, UP, DN of the PFD (phase frequency detector) 3. FIG. 6A depicts the normal operation state; FIG. 6B depicts the malfunction state.

Further, FIG. 6C depicts a time transition of the control voltage Vcntl in a normal operation state and a malfunction state. In FIG. 6C, a curve La indicates the time transition of the control voltage Vcntl in a normal operation state, while a curve Lb indicates the time transition of the control voltage Vcntl in a malfunction state. Further, in FIG. 6C, the reference sign t0 indicates the activation timing, while t1 indicates timing when a malfunction occurs.

FIGS. 6A to 6C depict when the control voltage Vcntl decreases from the high potential power supply voltage VDD to a lock voltage Vlock where stable multi-phase clocks are generated. The reference clock signal REF rises before the rising timing of the feedback clock signal FB. In other words, the phase of the REF is advanced than the FB.

First, as depicted in FIG. 6A, in the normal operation state, the control voltage Vcntl is controlled to be decreased from the power supply voltage VDD that is higher than the lock voltage Vlock. In other words, as the rising timing of the REF comes before the rising timing of the FB, a long period pulse signal DN of high level "H" is output. Note that, as described above, the reference sign δ1 indicates the simultaneous ON period during which signals UP, DN are simultaneously output, and δ2 indicates the setup period of the PFD 3.

Then, by normally performing feedback control as depicted in FIG. 6A, for example, as indicated by the curve La in FIG. 6C, the control voltage Vcntl is controlled to be decreased from the power supply voltage VDD to converge to the lock voltage Vlock.

On the other hand, as depicted in FIG. 6B, in a malfunction state, for example, when the PFD 3 performs processing by determining that the rising timing of the REF is after the rising timing of the FB, a pulse signal UP of which "H" period is longer than the signal DN is output.

Note that the above-described malfunction state may occur when the next edge of either the reference clock signal REF or the feedback clock signal FB rises in the section of δ1+δ2.

As such, for example, when it is determined that the rising timing of the REF comes after the rising timing of the FB at timing t1, as indicated by the curve Lb of FIG. 6C, the control voltage Vcntl is controlled to be increased to stay at the power supply voltage VDD. As the result, the DLL circuit becomes difficult to generate timing-adjusted output signals.

The following will describe embodiments of the timing adjustment circuit and the semiconductor integrated circuit device in detail with reference to the appended drawings. FIG. 7 is a block diagram depicting a first embodiment of the timing adjustment circuit.

In FIG. 7, the reference sign 1 indicates a voltage-controlled delay line (VCDL), 101 to 112 indicate delay units, 203 to 211 indicate waveform-shaping units, and 3 indicates a Phase Frequency Detector (PFD: phase detector). Further, the reference sign 4 indicates a Charge Pump (CP), 5 indicates a capacitor, 61 and 62 indicate mask circuits, and 7 indicates a startup circuit.

As depicted from the comparison between FIG. 7 and the above-described FIG. 1, the timing adjustment circuit (DLL circuit) of the first embodiment has an additional startup circuit 7 with reference to the timing adjustment circuit depicted in FIG. 1.

Note that, in FIG. 7, mask circuits 61, 62 that are controlled by the output signal of a NAND gate 73 (a gate signal xstup of a transistor 74) are provided, and the reference clock signal REF is output after outputting the feedback clock signal FB'.

The VCDL 1 includes a plurality of cascade-connected delay units 101 to 112. The output signals of the delay units 103 to 111 are respectively output as clock signals (multi-phase clocks) CK0 to CK360 via the corresponding waveform-shaping units 203 to 211.

In the timing adjustment circuit of the first embodiment, for example, the delay units 101 to 112 and the waveform-shaping units 203 to 211 may adopt equivalents to those of the timing adjustment circuit as described with reference to FIG. 1 or any known techniques. Specifically, the delay unit 100 depicted in FIG. 2 may be adopted as is to the delay units 101 to 112, for example.

The waveform-shaping units 203 to 211 are, for example, buffer circuits that output the output signals of the delay units 103 to 111 by amplifying the amplitude level of the output signals to a typical logic level. The buffer circuits are, for example, CMOS buffer circuits. A signal (CK0: reference clock signal) REF obtained by shaping the waveform of the output signal (a signal with 0-degree phase) of the delay unit 103 by the waveform-shaping unit 203 is masked by the mask circuit 61 for a predetermined period and is provided as a signal REF' to one input of the PFD 3.

Further, a signal (CK360: feedback clock signal) FB obtained by shaping the waveform of the output signal (a signal with 360 degree phase) of the delay unit 111 by the waveform-shaping unit 211 is masked by the mask circuit 62 for a predetermined period and is provided as a signal FB' to the other input of the PFD 3.

The PFD 3 detects a phase difference between the input reference clock signal REF' and the feedback clock signal FB' and outputs an UP signal UP or a DOWN signal DN to the CP 4. The mask circuits 61, 62 are for mask-controlling the REF and FB so as to output the signal REF' after outputting (rising of) the signal FB' upon activation, and, for example, controlled by the output signal (xstup) of the NAND gate 73.

The CP 4 controls an electric charge that the capacitor 5 stores according to the signals UP, DN from the PFD 3. As such, the control voltage Vcntl is controlled so that the phases of the reference clock signal REF (REF') and the feedback clock signal FB (FB') synchronize to each other (360 degrees (=0 degree)).

Note that, in the same way as described with reference to FIG. 1, in FIG. 7, the number of stages of delay units provided between the first delay unit 103 and the second delay unit 111 are not restricted to seven, and a desired number of multi-phase clocks may be generated. Further, it is to be appreciated that the circuit configuration may be a single-ended configuration instead of a differential configuration.

The startup circuit 7 has, for example, three stages of cascade-connected flipflops 711 to 713, inverters 721, 722, a NAND gate 73, and a pMOS transistor 74. The startup circuit 7 controls the control voltage Vcntl so that the control voltage Vcntl becomes a voltage around the aiming target voltage (lock voltage) Vlock upon activation.

As such, for example, even when the frequency of the input clock signal CLK is high and the operable phase range of the PFD 3 is narrow, the PFD 3 does not malfunction, enabling the DLL circuit (timing adjustment circuit) to generate timing-adjusted output signals.

Figure 8:
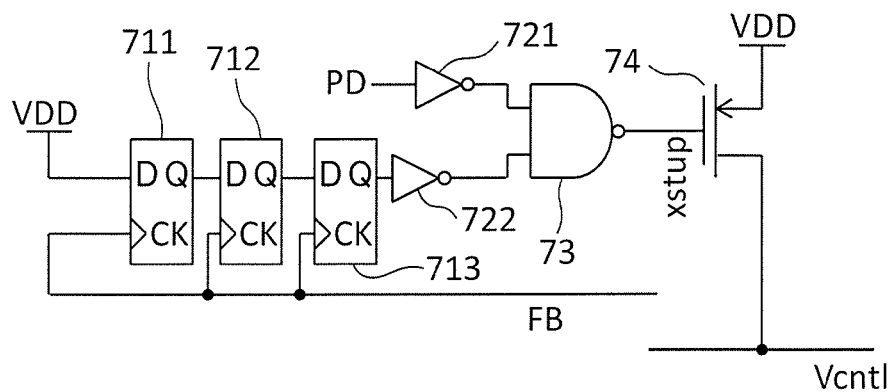
FIG. 8 is a circuit diagram depicting a startup circuit in the timing adjustment circuit of the first embodiment depicted in FIG. 7 extracted therefrom.
Figure 9:
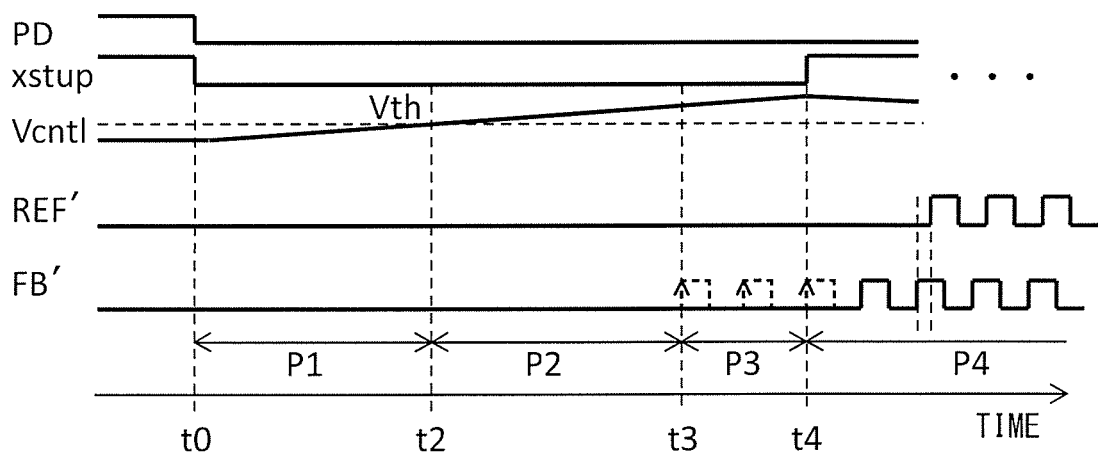
FIG. 9 is a timing diagram illustrating the operation of the startup circuit depicted in FIG. 8.

FIG. 8 is a circuit diagram depicting the startup circuit in the timing adjustment circuit of the first embodiment depicted in FIG. 7, extracted therefrom; FIG. 9 is a timing diagram illustrating the operation of the startup circuit depicted in FIG. 8.

As depicted in FIG. 8, in the startup circuit 7, the data input terminal D of the first stage flipflop 711 among the three stages of cascade-connected flipflops 711 to 713 is connected to the high-potential power wiring, so that the high potential power supply voltage VDD may be applied.

Note that, instead of the output signal FB' of the mask circuit 62, the output signal CK360 (feedback clock signal FB) of the waveform-shaping unit 211 is directly input to the clock terminals CK of the flipflops 711 to 713.

The data output terminal Q of the first stage flipflop 711 is connected to the data input terminal D of the second stage flipflop 712, while the data output terminal Q of the second stage flipflop 712 is connected to the data input terminal D of the third stage flipflop 713. The output signal from the data output terminal Q of the third stage flipflop 713 is supplied to the one input of the NAND gate 73 via the inverter 722.

A signal obtained by logic-inverting the activation signal (power down signal) PD by the inverter 721 is supplied to the other input of the NAND gate 73, then, the output signal of the NAND gate 73, as the gate signal xstup of the transistor 74, controls the transistor 74.

The activation signal PD is a signal that falls from high level "H" to low level "L" upon activation (t0). Further, the data output (Q) of each of the flipflops 711 to 713 is "L" at an initial state and maintained to "L" upon activation t0. Therefore, the output signal of the inverter 722 is "H".

As depicted in FIG. 9, for example, when the activation signal PD falls from "H" to "L" (the power down is released) at timing t0, both input signals of the NAND gate 73 become "H" and thus the output signal of the NAND gate 73 becomes "L".

As such, the gate signal xstup of the transistor 74 falls from "H" to "L", the transistor 74 turns ON, and the control voltage Vcntl continuously changes and gradually rises.

Although the control voltage Vcntl continuously rises during the period P1 from the timing t0 to t2, the control voltage Vcntl is lower, for example, than the threshold voltage Vth of the nMOS transistors Qn3, Qn4 in each of the delay units 100 (101 to 112) as described with reference to FIG. 2 (Vcntl<Vth). As such, the respective delay units 101 to 112 in the VCDL 1 do not propagate a signal.

Next, at timing t2, when the control voltage Vcntl exceeds the threshold voltage Vth (Vcntl>Vth), the delay units 101 to 112 are actuated, and each delay unit starts signal propagation operation that gives a delay amount according to the control voltage Vcntl to the respective input signals and outputs as an output signal.

Although the control voltage Vcntl further continues to rise during the period P2, the signal is not transmitted to the delay unit 111 (waveform-shaping unit 211), then, at timing t3, a feedback clock signal FB (CK360) is output from the waveform-shaping unit 211.

Then, during the period P3, the feedback clock signal FB output at timing t3 is processed by the flipflops 711 to 713 in the startup circuit 7, and, at a third rising timing t4 of the signal FB, the transistor 74 turns OFF.

In other words, the feedback clock signal FB is input to the clock inputs CK of the three stages of the flipflops 711 to 713, and, at the third rising timing t4 of the signal FB, the data output (Q) of the flipflop 713 changes from "L" to "H".

As such, the output of the inverter 722 changes from "H" to "L", the output signal (xstup) of the NAND gate 73 rises from "L" to "H", the transistor 74 turns OFF, and the startup circuit 7 stops.

By the operation of the startup circuit 7 (transistor 74) upon activation, the control voltage Vcntl becomes a voltage around the target lock voltage Vlock. Note that the operation after timing t4 when the transistor 74 turns OFF, i.e., the operation during the period P4 is, for example, the same as described with reference to FIGS. 1 to 5D.

Note that, at timing t4 when the startup circuit 7 stops, the control voltage Vcntl is preferably set to a voltage around the lock voltage Vlock and higher than Vlock (Vcntl>Vlock).

In order to set the control voltage Vcntl appropriate Vcntl>Vlock, for example, the number of stages of the flipflops (711 to 713) and the size of the pMOS transistor 74 in the startup circuit 7 are adjusted. Alternatively, as will be described with reference to FIG. 10, by adjusting the values of capacitors 81, 82 provided at the input of the VCDL 1, appropriate Vcntl>Vlock may be realized.

In other words, as the number of stages of the flipflops (711 to 713) increases, the period during which the startup circuit 7 operates may be longer, while, as the size of the transistor 74 becomes larger, the drive capability that pulls up the control voltage Vcntl may be higher. Note that, as the values of the capacitors 81, 82 provided at the input of the VCDL 1 are larger, the period during which the startup circuit 7 operates may be longer.

As such, the timing adjustment circuit of the first embodiment may normally operate without malfunctioning, such as the control voltage Vcntl stays at the power supply voltage VDD, for example, even when the frequency of the input clock signal CLK is high and the operable phase range of the PFD 3 is narrow.

In the above embodiment, as the startup circuit 7 does not operate except upon startup, i.e., the transistor 74 is OFF except upon startup, the startup circuit 7 does not affect generation operation of multi-phase clocks when the timing control circuit is performing normal operation.

Note that, as described above, the reference clock signal REF and the feedback clock signal FB are controlled so that the reference clock signal REF and the feedback clock signal FB are masked by the mask circuits 61 and 62 for a predetermined period and the signal REF' is output after the signal FB' is output to be given to the PFD 3.

In other words, after setting the control voltage Vcntl upon activation by the startup circuit 7 at timing t4, the feedback clock signal FB' rises first, then, the reference clock signal REF' rises. In such a case, the DOWN signal DN is output first from the PFD 3. The same is applied to the other embodiments as will be described below.

Figure 10:
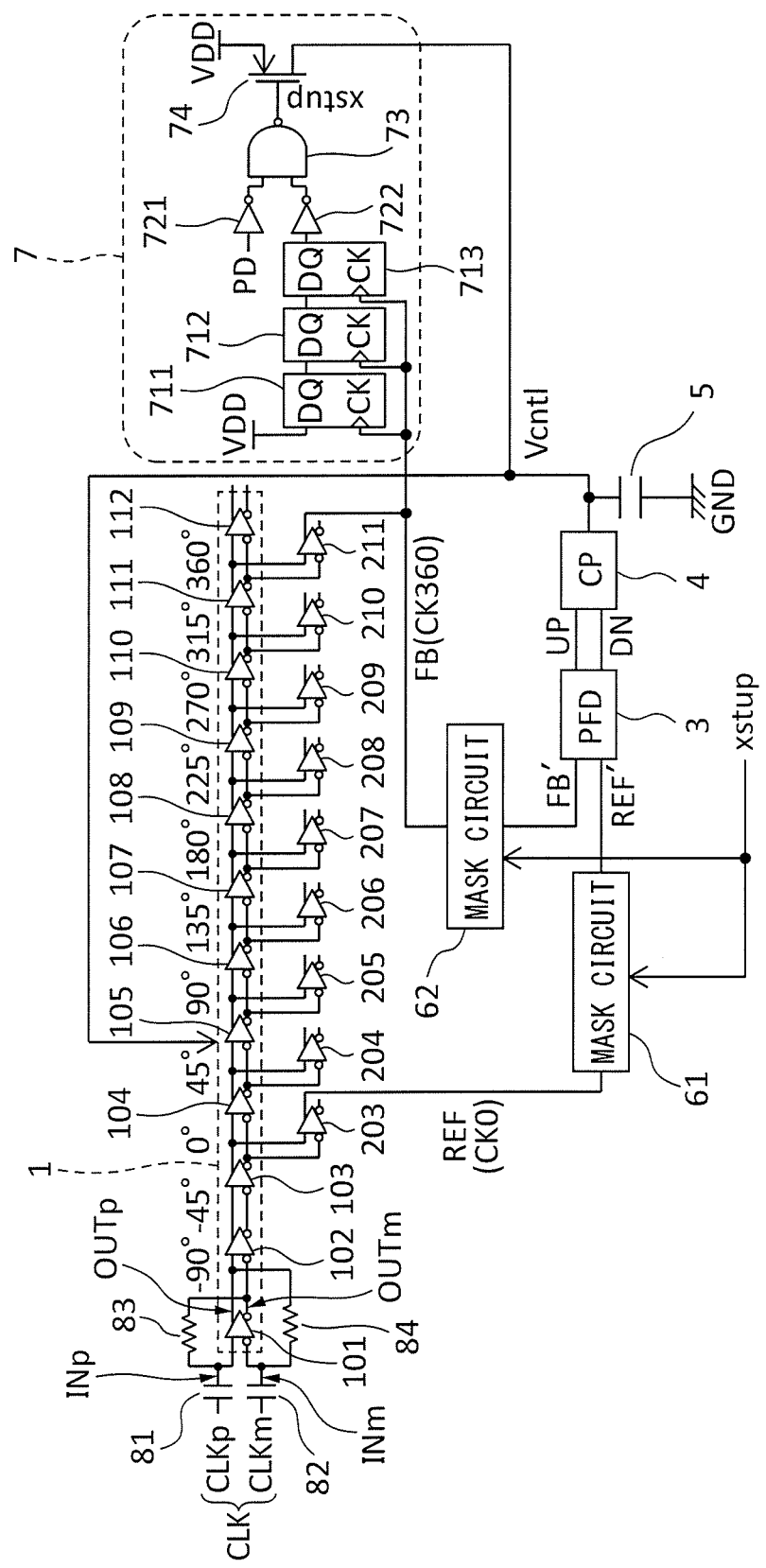
FIG. 10 is a block diagram depicting a second embodiment of the timing adjustment circuit.

FIG. 10 is a block diagram depicting a second embodiment of the timing adjustment circuit. As depicted from the comparison of FIG. 10 and the above-described FIG. 7, the timing adjustment circuit of the second embodiment has additional capacitors 81, 82 and resistors 83, 84 with reference to the timing adjustment circuit of the first embodiment.

As such, in the timing adjustment circuit of the second embodiment, differential clock signals CLKp, CLKm are input to differential inputs INp, INm of the first stage delay unit 101 in the VCDL (voltage-controlled delay line) 1 via the capacitors 81, 82. In other words, the input clock signal CLK (CLKp, CLKm) is input to the VCDL 1 (the first stage delay unit 101) via capacitive coupling.

Further, in the first stage delay unit 101, a resistor 83 is provided between the positive logic input INp and the negative logic output OUTm, as well as, a resistor 84 is provided between the negative logic input INm and the positive logic output OUTp, so as to make the common mode voltage Vcm closer to a predetermined voltage level.

Figure 11:
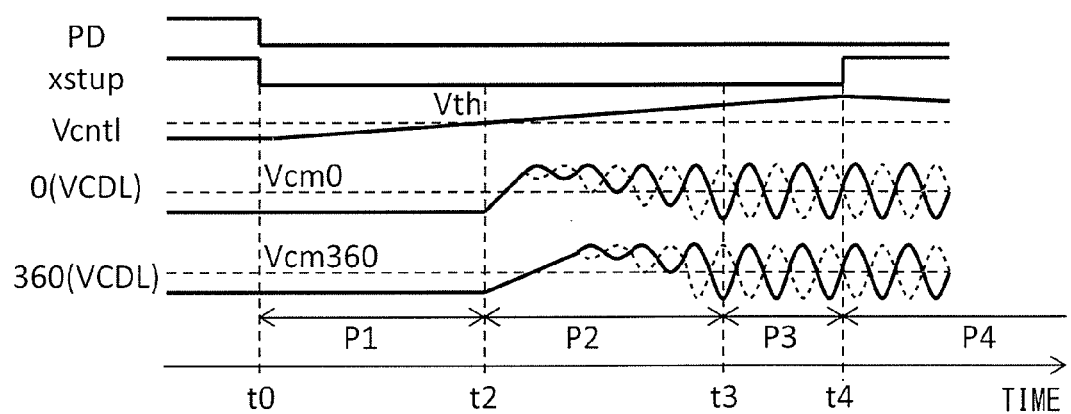
FIG. 11 is a diagram illustrating the operation of the timing adjustment circuit of the second embodiment depicted in FIG. 10.

FIG. 11 is a diagram illustrating the operation of the timing adjustment circuit of the second embodiment depicted in FIG. 10. In FIG. 11, the reference sign 0(VCDL) and Vcm0 indicate respectively a differential output signal of the delay unit 103 and the common voltage, and 360(VCDL) and Vcm360 indicate respectively a differential output signal of the delay unit 111 and the common voltage.

As depicted in FIG. 11, when the startup circuit 7 is activated (transistor 74 turns ON) at timing t0, the control voltage Vcntl gradually rises during the period P1. However, as the control voltage Vcntl is lower than the threshold voltage Vth, the delay units 101 to 112 do not propagate signals.

Next, at timing t2, when Vcntl becomes larger than Vth, the delay units 101 to 112 start propagating signals. However, the signals are propagated, the differential output signals 0(VCDL), 360(VCDL) and the common voltages Vcm0, Vcm360 of the delay units 103, 111 as depicted in the period P2 of FIG. 11, yet, the signals become hard to be transmitted to the waveform-shaping units 203, 211.

In other words, due to the capacitors 81, 82 provided at the first stage delay unit 101, the differential output signal 360 (VCDL) of the delay unit 111 becomes a signal with small amplitude as the common voltage Vcm360 is unstable, which makes hard to drive the waveform-shaping unit (CMOS buffer) 211. As such, the period until timing t3 when the common voltage Vcm360 becomes stable and the waveform-shaping unit 211 is driven to output the feedback clock signal FB becomes long.

Note that the operation after timing t4 when the transistor 74 turns OFF (the startup circuit 7 stops), i.e., the operation during the period P4, is, for example, the same as described with reference to FIGS. 1 to 5D.

As such, the timing adjustment circuit of the second embodiment may make the period, during which the startup circuit 7 operates, longer by inputting the input clock signal CLK to the VCDL 1 (the first stage delay unit 101) via the capacitive coupling. This, for example, allows decreasing the number of stages of the flipflops 711 to 713 in the startup circuit 7.

Figure 12:
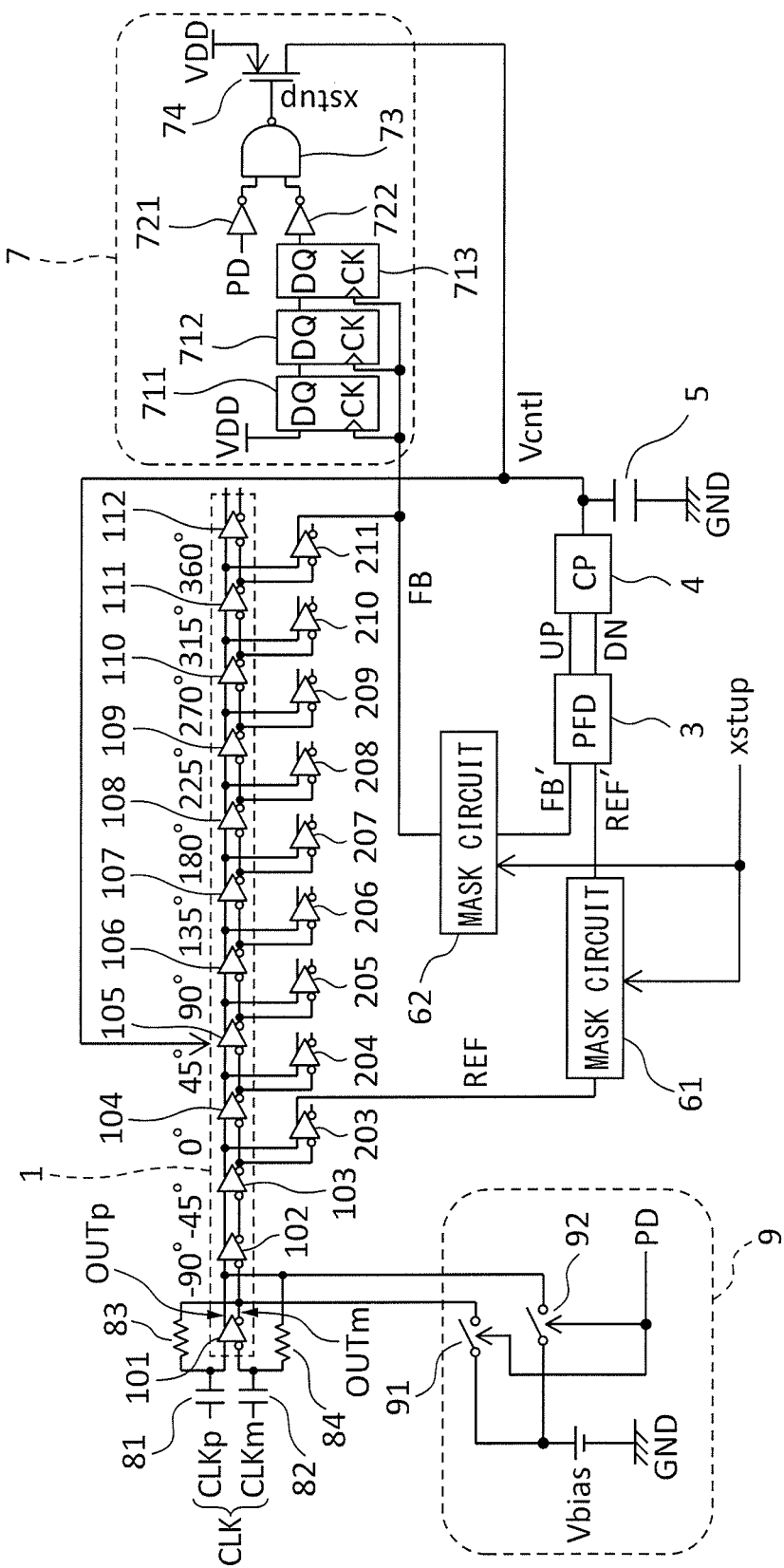
FIG. 12 is a block diagram depicting a third embodiment of the timing adjustment circuit.

FIG. 12 is a block diagram depicting a third embodiment of the timing adjustment circuit. As depicted from the comparison of FIG. 12 and the above-described in FIG. 10, the timing adjustment circuit of the third embodiment, an additional common voltage control circuit 9 is added to the timing adjustment circuit of the second embodiment.

As depicted in FIG. 12, the common voltage control circuit 9 controls switches 91, 92 using an activation signal (power down signal) PD.

In the second embodiment described with reference to FIG. 10, for example, the common voltage Vcm0 of the differential output signal 0(VCDL) of the delay unit 103 and the common voltage Vcm360 of the differential output signal 360(VCDL) of the delay unit 111 are unstable upon activation.

Thus, when the timing adjustment circuit is not activated (when power is down), the common voltage (Vcm-90) of the differential output signal of the first stage delay unit 101 is fixed at a predetermined voltage level (Vbias). As such, when the timing adjustment circuit is not activated, the activation signal PD is "H", and this activation signal PD of "H" turns the switches 91, 92 ON.

Then, in response to the falling of the activation signal PD from "H" to "L" at timing t0, the switches 91, 92 turn OFF. As such, upon activation of the timing adjustment circuit, the switches 91, 92 turn OFF to make the common voltage (differential output terminals OUTp, OUTm of the first stage delay unit 101) a floating state.

In this way, by making the common voltage upon activation a predetermined voltage level (Vbias), for example, the length of the period P2 in FIG. 11 may be made stable. In other words, the circuit may be designed based on the recognition of the operation period of the startup circuit 7 caused by inputting a clock signal CLK to the first stage delay unit 101 via capacitive coupling.

Figure 13:
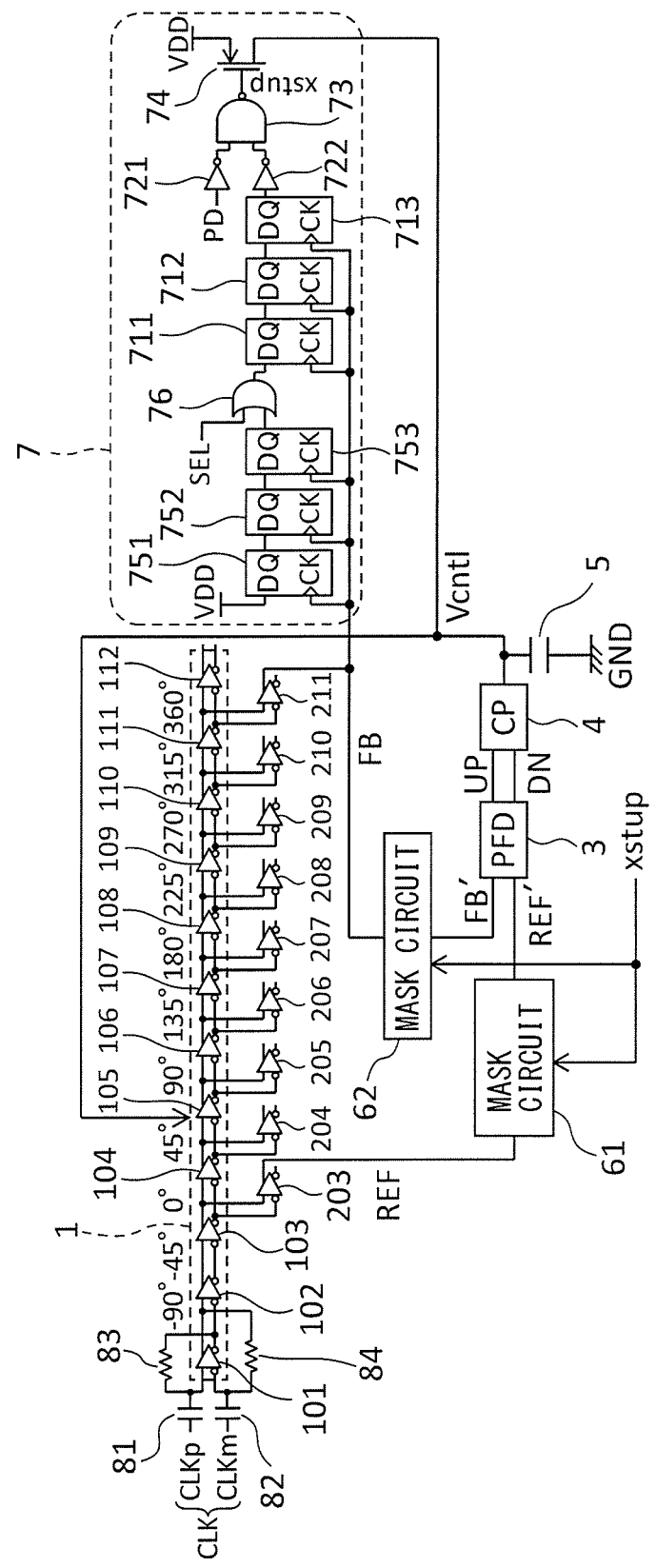
FIG. 13 is a block diagram depicting a fourth embodiment of the timing adjustment circuit.

FIG. 13 is a block diagram depicting a fourth embodiment of the timing adjustment circuit. As depicted from the comparison of FIG. 13 and the above-described FIG. 10, the timing adjustment circuit of the fourth embodiment is different from the timing adjustment circuit of the second embodiment in the configuration of the startup circuit 7.

The timing adjustment circuit of the fourth embodiment controls the number of stages of the flipflops in the startup circuit 7 according to the frequency of the input clock signal CLK (CLKp, CLKm), thereby controlling the period during which the startup circuit 7 operates.

As depicted in FIG. 13, in the timing adjustment circuit of the fourth embodiment, the startup circuit 7 further includes three stages of cascade-connected flipflops 751 to 753 and an OR gate 76 in addition to the circuit configuration of FIG. 10.

The feedback clock signal FB is input to the clock terminals CK of the flipflops 751 to 753, and a high potential power supply voltage VDD is applied to the data input terminal D of the first stage flipflop 751.

The data output terminal Q of the first stage flipflop 751 is connected to the data input terminal D of the second stage flipflop 752, while the data output terminal Q of the second stage flipflop 752 is connected to the data input terminal D of the third stage flipflop 753. The output signal from the data output terminal Q of the third stage flipflop 753 is supplied to the one input of the OR gate 76.

Note that a selection signal SEL is supplied to the other input of the OR gate 76, and the output signal of the OR gate 76 is supplied to the data input terminal D of the flipflop 711 in the startup circuit 7 of FIG. 10, instead of the high potential power supply voltage VDD.

Figure 14:
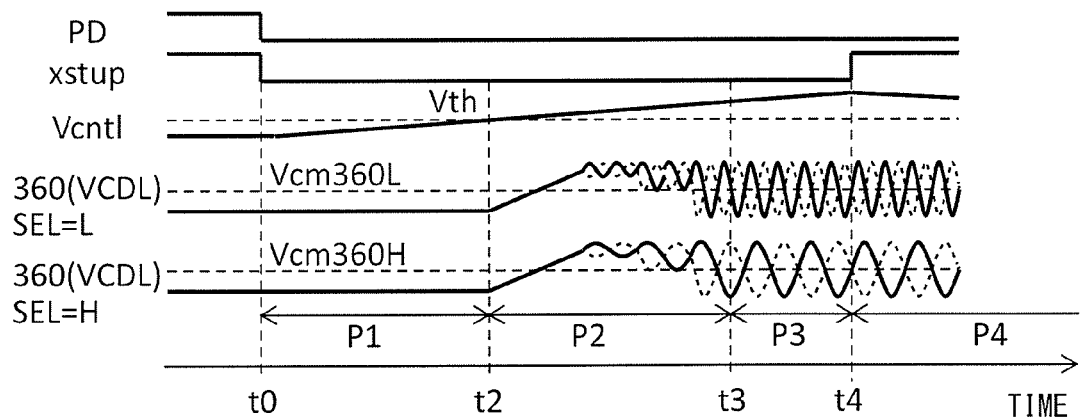
FIG. 14 is a diagram illustrating the operation of the timing adjustment circuit of the fourth embodiment depicted in FIG. 13.

FIG. 14 is a diagram illustrating the operation of the timing adjustment circuit of the fourth embodiment depicted in FIG. 13. In FIG. 14, when the frequency of the input clock signal CLK (CLKp, CLKm) is f1 at the time when the selection signal SEL is high level "H" (SEL=H), the frequency of the input clock signal CLK becomes f1×2 at the time when the selection signal SEL is low level "L" (SEL=L).

Further, the reference sign Vcm360H indicates a common voltage of the differential output signal of the delay unit 111 when the frequency of the input clock signal CLK is f1, while Vcm360L indicates a common voltage of the differential output signal of the delay unit 111 when the frequency of the clock signal CLK is f1×2.

As depicted in FIG. 14, for example, when the frequency of the input clock signal CLK is f1, the selection signal SEL is "H", and the output signal of the OR gate 76 becomes "H". Therefore, since the data input terminal D of the flipflop 711 becomes "H", the startup circuit 7 functions in the same way as above-described FIG. 10. In other words, the startup circuit 7 stops at the third rising timing of the feedback clock signal FB.

On the other hand, for example, when the frequency of the input clock signal CLK is f1×2, the selection signal SEL is "L", and the output signal of the OR gate 76 changes according to the signal level of the data output terminal Q of the flipflop 753. Thus, the signal of the data output terminal Q of the flipflop 753 is input to the data input terminal D of the flipflop 711, which means six stages of flipflops 751 to 753 and 711 to 713 are cascade-connected. As such, the startup circuit 7 stops at the sixth rising timing of the feedback clock signal FB.

In this way, the period during which the startup circuit 7 adjusts the control voltage Vcntl may be appropriately set whether the frequency of the CLK is, for example, f1 or twice as much the f1. Note that the switching of the number of stages of the flipflops is not restricted to switching in correspondence to the two different frequencies of the input clock signal CLK.

As such, according to the timing adjustment circuit of the fourth embodiment, for example, even when an input clock signal CLK with a different frequency is adopted, the ON period of the startup circuit 7 for adjusting the control voltage Vcntl upon activation may be appropriately set.

Figure 15:
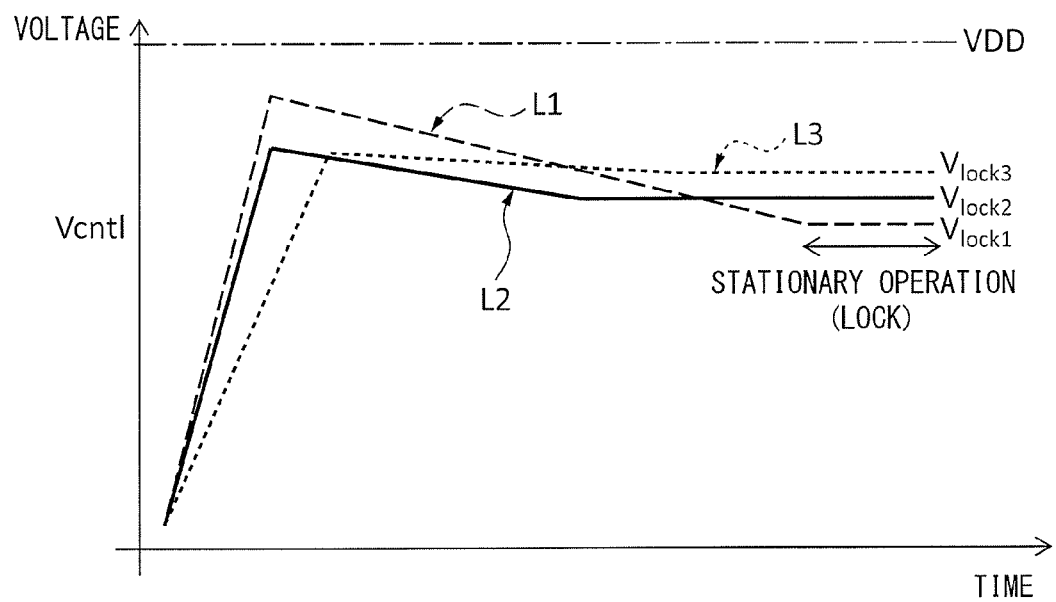
FIG. 15 is a diagram illustrating the effect of the timing adjustment circuit of each embodiment.

FIG. 15 is a diagram illustrating the effect of the timing adjustment circuit of each embodiment. In FIG. 15, the reference sign L1 indicates a relationship between a control voltage Vcntl using a high-speed (high drive capability) transistor and time, while L3 indicates a relationship between a control voltage Vcntl using a low-speed (low drive capability) transistor and time. Further, L2 indicates a relationship between a control voltage Vcntl using a middle-speed transistor and time.

Meanwhile, when producing semiconductors, for example, the characteristics of the transistors sometimes vary. According to the timing adjustment circuit of the embodiments, the control voltage Vcntl may be set to the target lock voltage Vlock where stationary operation is performed, regardless of the characteristics of the transistors.

In other words, as depicted by L1 of FIG. 15, when the operation speed of the transistor of a produced timing adjustment circuit is high, the control voltage Vcntl may be set to a lock voltage Vlock1 that is suitable for the timing adjustment circuit using the high-speed transistor.

Further, as depicted by L3 of FIG. 15, when the operation speed of the transistor of a produced timing adjustment circuit is low, the control voltage Vcntl may be set to a lock voltage Vlock3 that is suitable for the timing adjustment circuit using the low-speed transistor.

Furthermore, as depicted by L2 of FIG. 15, when the operation speed of the transistor of a produced timing adjustment circuit is intermediate, the control voltage Vcntl may be set to a lock voltage Vlock2 that is suitable for the timing adjustment circuit using the middle-speed transistor.

In this way, with the timing adjustment circuit of each embodiment, even when the characteristics of the transistors vary, the control voltage Vcntl may be adjusted to a voltage around the lock voltage Vlock (Vlock1 to Vlock3) suitable for the characteristics of the transistor.

Thus, for example, even when the frequency of the input clock signal CLK is high and the operable phase range of the PFD 3 is narrow, the timing adjustment circuit may operate normally by eliminating malfunction of the PFD 3.

Figure 16:
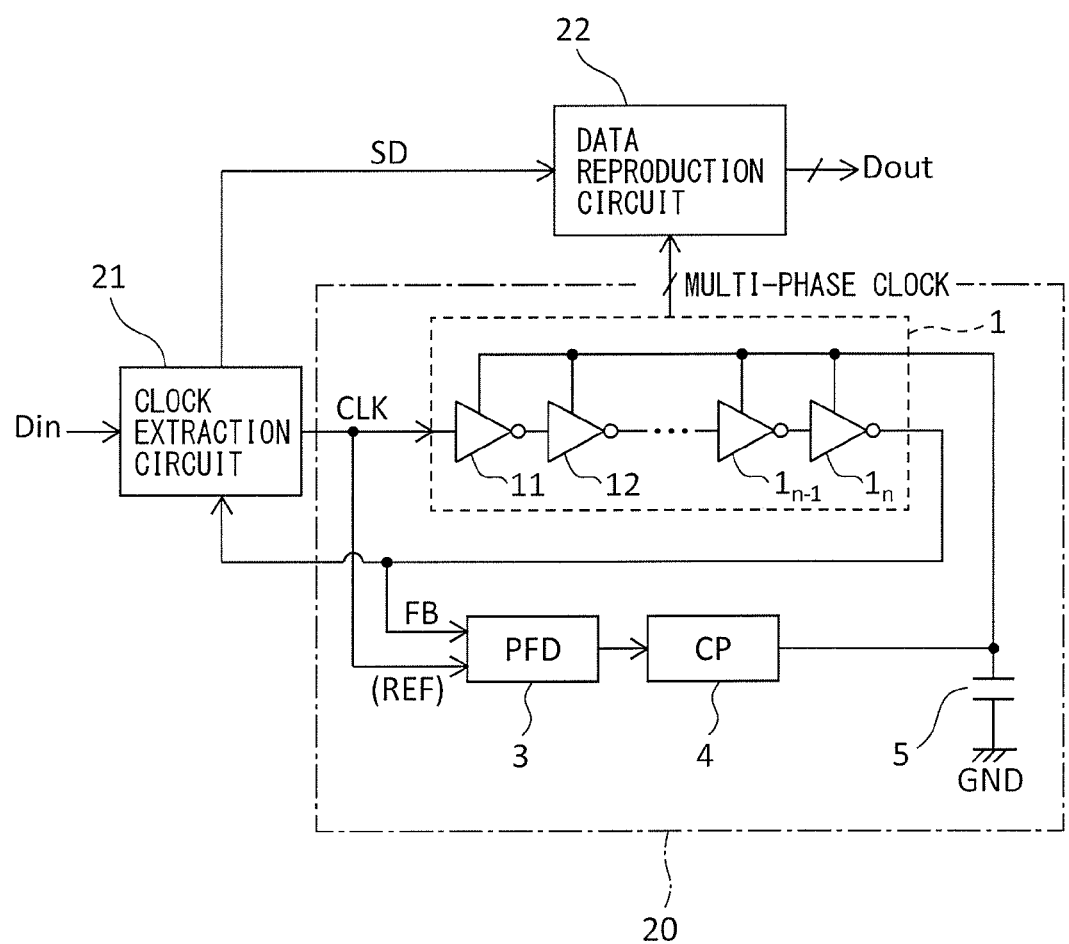
FIG. 16 is a block diagram depicting an example of a semiconductor integrated circuit device that adopts the timing adjustment circuit of the embodiments.

FIG. 16 is a block diagram depicting an example of the semiconductor integrated circuit device that adopts the timing adjustment circuit of the embodiments. FIG. 16 depicts a clock data recovery (CDR) circuit.

As depicted in FIG. 16, the CDR circuit includes a timing adjustment circuit (DLL circuit) 20, a clock extraction circuit 21, and a data reproduction circuit 22. In FIG. 16, the timing adjustment circuit of each of the above-described embodiments is adopted as a circuit 20. Note that, in FIG. 16, the delay units 101 to 112 and the waveform-shaping units 203 to 211 are drawn as inverters (delay elements) 11 to 1n.

The serial data Din input from outside is separated into a clock signal CLK and a data signal (data component) SD by the clock extraction circuit 21, and the clock signal CLK is input to the timing adjustment circuit 20.

The timing adjustment circuit 20 receives the clock signal CLK, generates a plurality of clocks with different phases (multi-phase clocks) and outputs to the data reproduction circuit 22 (an internal circuit). The data reproduction circuit 22 receives the data component SD from the clock extraction circuit 21, determines the level according to the multi-phase clocks, and outputs predetermined parallel data Dout.

When the multi-phase clocks received from the timing adjustment circuit 20 is, for example, eight-phase clocks, the data reproduction circuit 22 outputs 8-bit parallel data Dout by incorporating the serial data component SD at a rising timing of the eight-phase clocks. Note that when the bit rate of the data component SD (serial data Din) is A [bps], the bit rate of the parallel data Dout becomes A/8 [bps].

Note that the CDR circuit depicted in FIG. 16 is merely an example of the semiconductor integrated circuit device that adopts the timing adjustment circuit of the embodiments. The timing adjustment circuit of the embodiments may be widely adopted, for example, in a variety of semiconductor integrated circuit devices that use multi-phase clocks.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A timing adjustment circuit comprising:
    a voltage-controlled delay line configured to receive an input clock signal and generate multi-phase clocks, a delay amount of each of the multi-phase clocks being changed according to a control voltage;
    a phase detector configured to detect a phase difference between a first clock and a second clock, the first clock being a reference, the second clock being generated from the voltage-controlled delay line;
    a control voltage generation circuit configured to generate the control voltage on the basis of the detected phase difference; and
    a startup circuit configured to operate for a certain period after activation, and continuously change the control voltage between a first voltage and a second voltage.

2. The timing adjustment circuit according to claim 1, wherein
    the startup circuit is configured to adjust the control voltage to a voltage around a lock voltage during a period until the second clock is generated from the voltage-controlled delay line after the activation.

3. The timing adjustment circuit according to claim 2, wherein
    the lock voltage is defined according to a level of the control voltage when the voltage-controlled delay line is in a stationary operation.

4. The timing adjustment circuit according to claim 2, wherein
    the startup circuit is configured to adjust the control voltage to be a voltage higher than the lock voltage.

5. The timing adjustment circuit according to claim 1, wherein
    the startup circuit is configured to stop after counting the second clock for a first number.

6. The timing adjustment circuit according to claim 5, wherein
    the startup circuit includes:
        the first number of flipflops configured to count the input clock signal;
        a logic circuit configured to implement a logical operation on an activation signal that indicates activation timing and an output of the first number of flipflops; and
        a transistor configured to be controlled by an output signal of the logic circuit and adjust the level of the control voltage.

7. The timing adjustment circuit according to claim 1, wherein the startup circuit is configured to:
stop after counting the second clock for a second number when a frequency of the input clock signal is a first frequency; and
stop after counting the second clock for a third number that is larger than the second number when the frequency of the input clock signal is a second frequency that is higher than the first frequency.

8. The timing adjustment circuit according to claim 7, wherein
the startup circuit includes:
a fourth number of first flipflops configured to count the second clock for the second number when the frequency of the input clock signal is the first frequency;
a fifth number of second flipflops configured to count the second clock for the third number by cooperating with the first flipflops when the frequency of the input clock signal is the second frequency;
a first logic circuit configured to implement a logical operation on an activation signal indicating activation timing and an output of the first flipflops;
a second logic circuit configured to control switching between use of the first flipflops and use of both the first flipflops and the second flipflops on the basis of whether the frequency of the input clock signal is the first frequency or the second frequency; and
a transistor configured to be controlled by an output signal of the first logic circuit and adjust the level of the control voltage.

9. The timing adjustment circuit according to claim 1, wherein
the voltage-controlled delay line is configured to receive the input clock signal, generate the first clock by giving a first delay amount to the input clock signal, and generate the second clock by giving a second delay amount that is larger than the first delay amount to the input clock signal.

10. The timing adjustment circuit according to claim 9, wherein
the control voltage generation circuit is configured to generate the control voltage to synchronize phases of the first clock and the second clock.

11. The timing adjustment circuit according to claim 1, wherein
the voltage-controlled delay line includes a plurality of cascade-connected delay units, a delay amount of each of the plurality of cascade-connected delay units being changed according to the control voltage;
the input clock signal is input to a first stage delay unit among the plurality of cascade-connected delay units; and
when n and m are positive integers and n is smaller than m, the first clock is output from an n-th stage delay unit among the plurality stages of delay units, and the second clock is output from an m-th stage delay unit among the plurality stages of delay units.

12. The timing adjustment circuit according to claim 11, wherein
the input clock signal is input to the first stage delay unit via a capacitor.

13. The timing adjustment circuit according to claim 12, wherein
the input clock signal is a differential input clock signal, and
the capacitor includes:
a first capacitor configured to be provided at a positive logic input of the first stage delay unit and receive a positive logic input clock signal of the differential input clock signal; and
a second capacitor configured to be provided at a negative logic input of the first stage delay unit and receive a negative logic input clock signal of the differential input clock signal.

14. The timing adjustment circuit according to claim 13, the timing adjustment circuit further comprising:
a first resistor provided between the positive logic input and a negative logic output of the first stage delay unit; and
a second resistor provided between the negative logic input and a positive logic output of the first stage delay unit.

15. The timing adjustment circuit according to claim 13, the timing adjustment circuit further comprising:
a common voltage control circuit configured to control, before activation, a common mode voltage of a differential output signal of the first stage delay unit to a fixed voltage, and, after activation, make a differential output terminal of the first stage delay unit a floating state.

16. The timing adjustment circuit according to claim 1, the timing adjustment circuit further comprising:
a first mask circuit configured to mask the first clock; and
a second mask circuit configured to mask the second clock, wherein an output signal of the second mask circuit is output before an output signal of the first mask circuit.

17. The timing adjustment circuit according to claim 6, the timing adjustment circuit further comprising:
a first mask circuit configured to mask the first clock; and
a second mask circuit configured to mask the second clock, wherein
an output signal of the second mask circuit is output before an output signal of the first mask circuit, and
the first mask circuit and the second mask circuit are configured to receive the output signal of the logic circuit to perform mask control.

18. The timing adjustment circuit according to claim 8, the timing adjustment circuit further comprising:
a first mask circuit configured to mask the first clock; and
a second mask circuit configured to mask the second clock, wherein
an output signal of the second mask circuit is output before an output signal of the first mask circuit, and
the first mask circuit and the second mask circuit are configured to receive the output signal of the first logic circuit to perform mask control.

19. A semiconductor integrated circuit device comprising:
a timing adjustment circuit; and
an internal circuit configured to receive multi-phase clocks generated by the timing adjustment circuit and perform a process, wherein
the timing adjustment circuit includes:
a voltage-controlled delay line configured to receive an input clock signal and generate the multi-phase clocks, delay amount of each of the multi-phase clocks being changed according to a control voltage;
a phase detector configured to detect a phase difference between a first clock and a second clock, the first clock being a reference, the second clock being generated from the voltage-controlled delay line;
a control voltage generation circuit configured to generate the control voltage on the basis of the detected phase difference; and a startup circuit configured to operate for a certain period after activation, and continuously change the control voltage between a first voltage and a second voltage.

20. The semiconductor integrated circuit device according to claim 19, wherein
the startup circuit is configured to adjust the control voltage to a voltage around a lock voltage during a period until the second clock is generated from the voltage-controlled delay line after the activation.

21. The semiconductor integrated circuit device according to claim 19, wherein
the startup circuit is configured to stop after counting the second clock for a first number.

22. The semiconductor integrated circuit device according to claim 21, wherein
the startup circuit includes:
the first number of flipflops configured to count the input clock signal;
a logic circuit configured to implement a logical operation on an activation signal that indicates activation timing and an output of the first number of flipflops; and
a transistor configured to be controlled by an output signal of the logic circuit and adjust the level of the control voltage.

23. The semiconductor integrated circuit device according to claim 19, wherein
the startup circuit is configured to:
stop after counting the second clock for a second number when a frequency of the input clock signal is a first frequency; and
stop after counting the second clock for a third number that is larger than the second number when the frequency of the input clock signal is a second frequency that is higher than the first frequency.

24. The semiconductor integrated circuit device according to claim 23, wherein
the startup circuit includes:
a fourth number of first flipflops configured to count the second clock for the second number when the frequency of the input clock signal is the first frequency;
a fifth number of second flipflops configured to count the second clock for the third number by cooperating with the first flipflops when the frequency of the input clock signal is the second frequency;
a first logic circuit configured to implement a logical operation on an activation signal indicating activation timing and an output of the first flipflops;
a second logic circuit configured to control switching between use of the first flipflops and use of both the first flipflops and the second flipflops on the basis of whether the frequency of the input clock signal is the first frequency or the second frequency; and
a transistor configured to be controlled by an output signal of the first logic circuit and adjust the level of the control voltage.

25. The semiconductor integrated circuit device according to claim 19, wherein
the voltage-controlled delay line includes a plurality of cascade-connected delay units, a delay amount of each of the plurality of cascade-connected delay units being changed according to the control voltage;
the input clock signal is input to a first stage delay unit among the plurality of cascade-connected delay units; and
when n and m are positive integers and n is smaller than m, the first clock is output from an n-th stage delay unit among the plurality stages of delay units, and the second clock is output from an m-th stage delay unit among the plurality stages of delay units.

26. The semiconductor integrated circuit device according to claim 19, wherein the timing adjustment circuit further includes:
a first mask circuit configured to mask the first clock; and
a second mask circuit configured to mask the second clock,
wherein an output signal of the second mask circuit is output before an output signal of the first mask circuit.

27. The semiconductor integrated circuit device according to claim 22, wherein the timing adjustment circuit further includes:
a first mask circuit configured to mask the first clock; and
a second mask circuit configured to mask the second clock, wherein
an output signal of the second mask circuit is output before an output signal of the first mask circuit, and
the first mask circuit and the second mask circuit are configured to receive the output signal of the logic circuit to perform mask control.

28. The semiconductor integrated circuit device according to claim 24, wherein the timing adjustment circuit further includes:
a first mask circuit configured to mask the first clock; and
a second mask circuit configured to mask the second clock, wherein
an output signal of the second mask circuit is output before an output signal of the first mask circuit, and
the first mask circuit and the second mask circuit are configured to receive the output signal of the first logic circuit to perform mask control.

* * * * *